United States Patent [19]
Woerlee

[11] Patent Number: 5,966,616
[45] Date of Patent: Oct. 12, 1999

[54] METHOD OF MANUFACTURING A SEMICONDUCTOR DEVICE HAVING "SHALLOW TRENCH ISOLATION"

[75] Inventor: Pierre H. Woerlee, Eindhoven, Netherlands

[73] Assignee: U.S. Philips Corporation, New York, N.Y.

[21] Appl. No.: 09/044,499

[22] Filed: Mar. 19, 1998

[30] Foreign Application Priority Data

Apr. 7, 1997 [EP] European Pat. Off. .............. 97201020

[51] Int. Cl.⁶ .................................................. H04L 21/762
[52] U.S. Cl. .......................................................... 438/424
[58] Field of Search .......................... 438/424, FOR 227, 438/425, 426, 783, 791, 762; 148/DIG. 50, DIG. 85, DIG. 86

[56] References Cited

U.S. PATENT DOCUMENTS 5,387,540  2/1995  Poon et al. .
5,643,825  7/1997  Gardner et al. .

FOREIGN PATENT DOCUMENTS

99162185A0  6/1967  Japan .

OTHER PUBLICATIONS

"An Optimized Densification of the Filled Oxide for Quarter Micron Shallow Trench Isolation (STI)", H.S. Lee et al., Digest of Technical Papers of IEEE Symposium on VLSI Technology, 1996, pp. 158–159.

*Primary Examiner*—George R. Fourson
*Attorney, Agent, or Firm*—Brian J. Wieghaus

[57] ABSTRACT

A method of manufacturing a semiconductor device, in which trenches (7) are formed in a surface (2) of a silicon body (1), which trenches are filled with silicon oxide (11). The filled trenches are used as field-oxide regions (12) in integrated circuits. The silicon oxide is deposited from a gas phase and is subsequently densified by means of a thermal treatment in an NO or $N_2O$-containing atmosphere. The deposited silicon oxide can be densified in a very short period of time, and, in addition, the thermal treatment does not cause crystal defects. The method can suitably be used for "single wafer processing".

3 Claims, 3 Drawing Sheets

METHOD OF MANUFACTURING A SEMICONDUCTOR DEVICE HAVING "SHALLOW TRENCH ISOLATION"

The invention relates to a method of manufacturing a semiconductor device, in which method trenches are formed in a surface of a silicon body which are filled with silicon oxide which is deposited from a gas phase and, subsequently, densified by means of a thermal treatment in a nitrogen-containing atmosphere.

In practice, the silicon-oxide-filled trenches are used as field-isolation regions enclosing active regions. In the active regions thus isolated from each other, semiconductor elements, such as MOS-transistors and EPROM-cells can be formed. This manner of isolating active regions from each other is referred to as "shallow trench isolation".

The silicon oxide can be deposited from a gas phase in various, conventional ways. The gas phase may comprise, for example, tetraethoxy silane (TEOS) or a gas mixture containing, for example, silane and oxygen, and the deposition operation can be carried out at atmospheric or sub-atmospheric pressure. It is also possible to accelerate the deposition process by means of a plasma. Using a "High Density Plasma Chemical Vapor Deposition" process, a layer of silicon oxide can be deposited at a low temperature, for example, of 400° C. Silicon oxides formed by deposition can very easily be etched in customary hydrogen-fluoride etching baths. They are etched at a much higher rate than silicon oxides formed by thermal oxidation of silicon. This causes practical problems in the manufacture of semiconductor devices. This is the reason why, in practice, deposition-formed silicon oxides which are used to form field-oxide regions are densified by means of a thermal treatment.

From "An Optimized Densification of the Filled Oxide for Quarter Micron Shallow Trench Isolation (STI)", H. S. Lee et al., Digest of Technical Papers of the IEEE Symposium on VLSI Technology, 1996, pp. 158–159, a method of the type mentioned in the opening paragraph is known, in which the densification of silicon oxide formed by deposition is carried out by means of a thermal treatment in nitrogen. In this process, the silicon body is heated for 1 hour at a temperature of 1150° C. By carrying out the thermal treatment in nitrogen, oxidation of the silicon situated next to the trenches during the thermal treatment is precluded. Oxidation could lead to mechanical stresses in the silicon. This would be the case if the densification operation is carried out by means of a thermal treatment in vapor. Apart from the densification of the deposited oxide, in said operation also the side walls of the trenches are oxidized. The formation of this silicon oxide, whose volume is larger than that of the silicon from which it is formed, causes said stresses. Such stresses may cause crystal defects which may give rise to leakage currents in semiconductor elements formed in the active regions.

By heating it in nitrogen, deposited silicon oxide can be densified such that it is etched almost as rapidly in customary etching baths with hydrogen fluoride as silicon oxide formed by thermal oxidation. In this case, said oxidation of the side walls of the trenches does not take place so that the formation of crystal defects during densification is precluded. For practical applications, however, the thermal treatment takes up far too much time. In current processes for the manufacture of highly-integrated semiconductor devices (VLSI), silicon wafers are treated one by one. For such "single wafer processing", a thermal treatment which takes 1 hour is unsuitable.

It is an object of the invention to provide a method in which silicon oxide deposited in the trenches can be densified in a much shorter period of time, and which method can consequently be used in the manufacture of semiconductor devices by means of "single wafer processing".

To achieve this, the method mentioned in the opening paragraph is characterized in that the deposited silicon oxide is densified in an NO or $N_2O$-containing atmosphere.

In practice it has been found that by carrying out the densification operation in an NO or $N_2O$-containing atmosphere, said densification can be realized in a very short time period, and, in addition, the thermal treatment does not lead to crystal defects. When use is made of an NO or $N_2O$-containing atmosphere, the silicon side walls of the trenches are nitrided and oxidation of the side walls during densification of the deposited oxide does not take place.

Preferably, the deposited silicon oxide is densified by subjecting the silicon body in an NO or $N_2O$-containing atmosphere to a thermal treatment at a temperature of 1000 to 1150° C. for 0.5 to 3 minutes. The etching rate of the resultant, densified silicon oxide in hydrogen-fluoride etching baths is similar to that of silicon oxide formed by thermal oxidation. By virtue of said high temperature, also mechanical stresses induced in the deposited silicon oxide during deposition are completely relaxed.

In addition, preferably, the deposited silicon oxide is densified by heating the silicon body in an NO or $N_2O$-containing atmosphere at a pressure of 1 atmosphere. The deposited silicon oxide can then be densified in a customary "rapid thermal processing" reactor.

These and other aspects of the invention will be apparent from and elucidated with reference to the embodiments described hereinafter.

BRIEF DESCRIPTION OF THE DRAWINGS:

FIG. 1 is a schematic, cross-sectional view of a silicon body 1 having a surface 2 on which an approximately 10 nm thick layer of silicon oxide 3 and an approximately 150 nm thick layer of silicon nitride 4 are formed by thermal oxidation and deposition, respectively. A photoresist mask 5 is formed in a customary manner on the silicon-nitride layer 4. This photoresist mask 5 covers the silicon-nitride layer 4 at the locations where active regions 13 must be formed in the silicon body, and is provided with windows 6, within which the layer of silicon nitride 4 is exposed, at the locations where field-oxide regions 12 must be formed in the silicon body 1.

Figure 1:
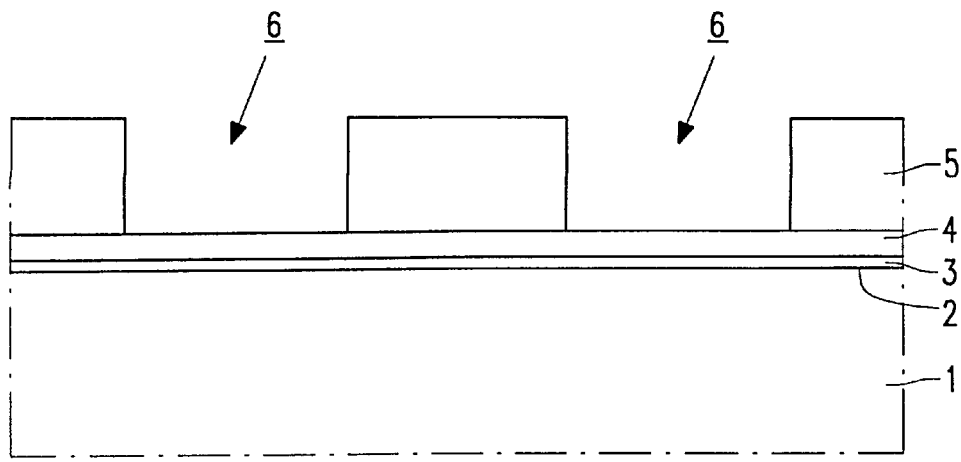
FIGS. 1 through 8 are schematic, cross-sectional views of a few stages in the manufacture of a semiconductor device using the method in accordance with the invention.
Figure 2:
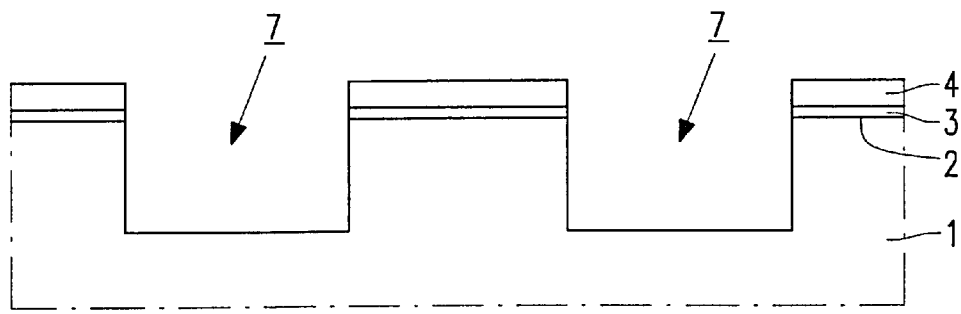
Figure 3:
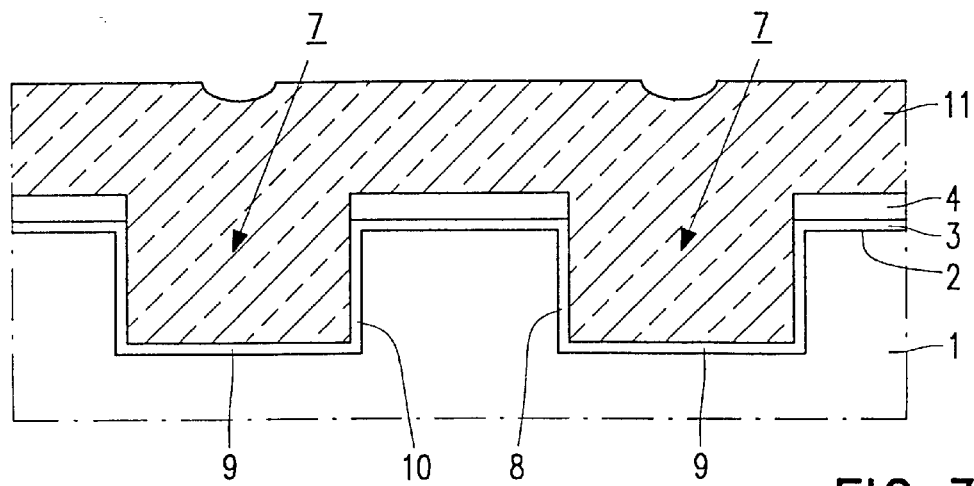

Subsequently, the semiconductor body 1 is subjected to a customary etching treatment. In this treatment, as shown in FIG. 2, the parts of the silicon-nitride layer 4 and the silicon-oxide layer 3 situated within the windows 6 of the photoresist mask 5 are removed from the surface 2, and trenches 7 having a depth of approximately 400 nm and a width of approximately 500 nm are formed in the silicon body 1. After the walls 8 and the bottom 9 of the grooves 7 have been provided with an approximately 10 nm thick layer of silicon oxide 10 formed by thermal oxidation, a thick layer of silicon oxide 11, as shown in FIG. 3, is deposited. The silicon-oxide layer 11 is deposited in such a thickness that the trenches 7 are completely filled with silicon oxide. In this example, said thickness is approximately 750 nm.

The silicon-oxide layer 11 can be deposited from a gas phase in various, customary ways. The gas phase may comprise, for example, tetraethoxy silane (TEOS) or a gas mixture containing, for example, silane and oxygen, and the deposition process may be carried out at atmospheric or sub-atmospheric pressure. It is also possible to accelerate the deposition process by means of a plasma. A "High Density Plasma Chemical Vapor Deposition" process can be used to deposit a layer of silicon oxide at a low temperature, for example, of 400° C.

Figure 4:
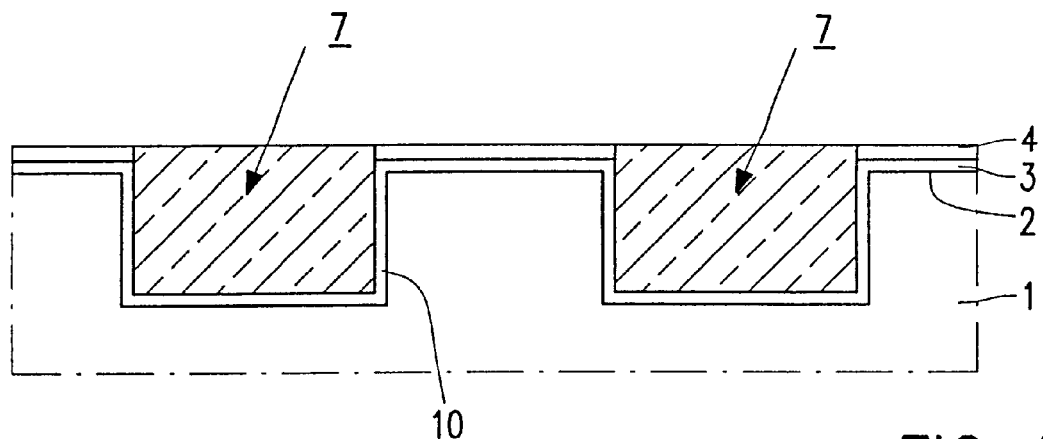
Figure 5:
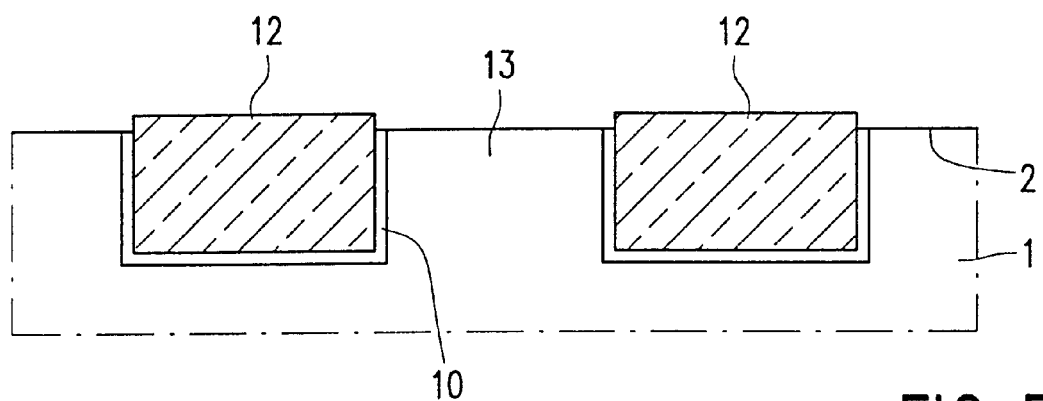

Subsequently, as shown in FIG. 4, the silicon-oxide layer 11 is subjected to a customary chemical-mechanical polishing treatment. This treatment is continued until the layer of silicon nitride 4 is exposed. Thus, the trenches 7 are filled with silicon oxide. Subsequently, the silicon-nitride layer 4 and the silicon-oxide layer 3 are removed, resulting in the formation of field-oxide regions 12 which enclose the active regions 13 of the semiconductor body 1.

Figure 6:
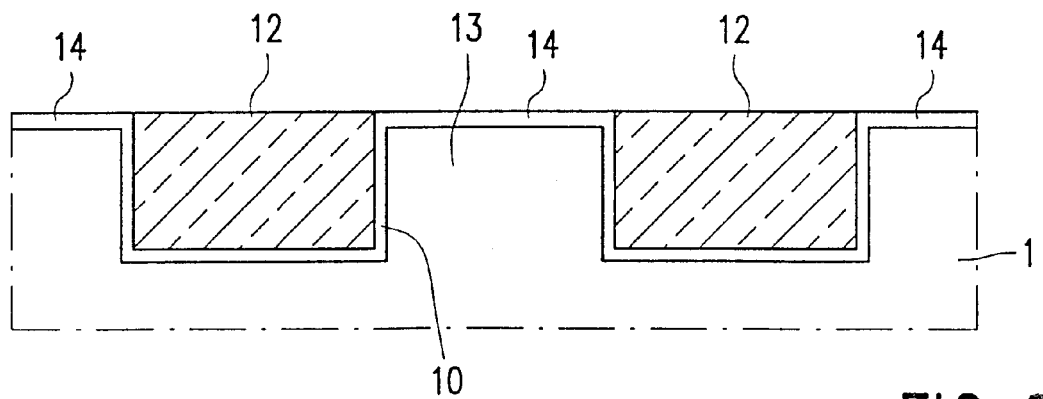

Subsequently, the surface 2 of the active regions 13 is cleaned. For this purpose, a thermal-oxidation operation is carried out in which an approximately 200 nm thick layer of silicon oxide 14 as shown in FIG. 6 is formed, which is subsequently etched away again in a hydrogen-fluoride etching solution. The silicon-oxide layer 14 is a layer of "sacrificial oxide". During etching away the silicon-oxide layer 14, also a layer of the deposited and subsequently polished oxide 11 of the field-oxide regions 12 is etched away.

Figure 7:
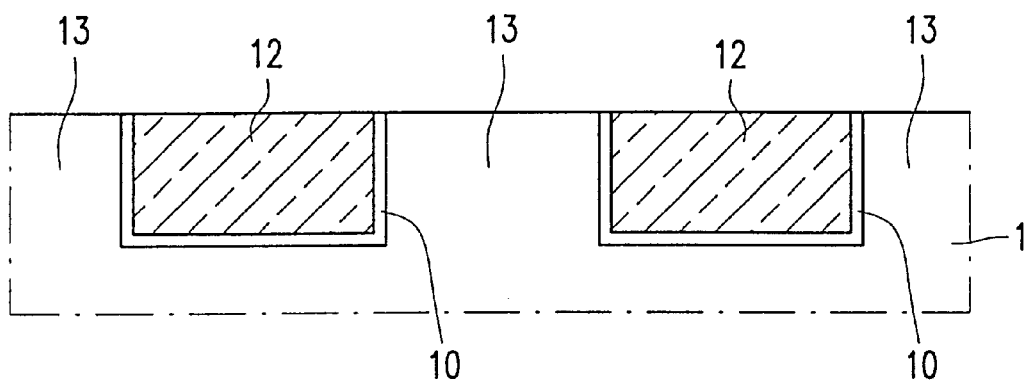
Figure 8:
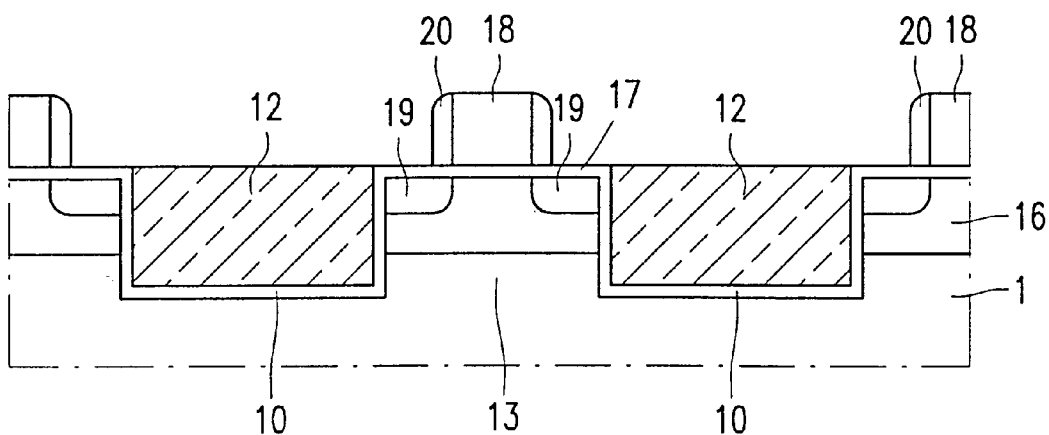

Deposition-formed silicon oxides are readily etched in customary hydrogen-fluoride etching baths. They are etched much more rapidly than silicon oxides formed by thermal oxidation of silicon. This causes practical problems in the manufacture of semiconductor devices. The silicon-oxide layer 11 formed by deposition, which is used to form field-oxide regions 12, could be subject, for example during etching away the "sacrificial oxide" layer 14 formed by thermal oxidation, to a very strong etching effect. To ensure that the flat structure shown in FIG. 7 is obtained, prior to the chemical-mechanical polishing treatment, the deposited silicon-oxide layer 11 is densified by means of a thermal treatment. As a result thereof, the rate at which the deposited silicon-oxide layer 11 is etched in a hydrogen-fluoride bath is almost equal to that of a silicon-oxide layer formed by thermal oxidation, such as the "sacrificial oxide" layer 14. During etching away this "sacrificial oxide" layer, only a very thin layer of the deposited and polished silicon-oxide layer 11 is etched away. In this manner, the flat structure shown in FIG. 7 is obtained.

The deposited silicon oxide 11 is densified in an NO or $N_2O$-containing atmosphere. In practice it has been found that by carrying out the densification operation in an NO or $N_2O$-containing atmosphere, said densification can be realized in a very short period of time and, in addition, the thermal treatment does not cause crystal defects. When use is made of an NO or $N_2O$-containing atmosphere, the silicon side walls of the trenches are nitrided and oxidation of the side walls during densification of the deposited oxide does not take place. Said oxidation would take place if the densification is carried out by means of a thermal treatment in vapor. Apart from the densification of the deposited oxide, oxidation of the side walls of the trenches would take place. The formation of this silicon oxide, whose volume is larger than that of the silicon from which it is formed, causes stresses. Such stresses may cause crystal defects which may give rise to leakage currents in semiconductor elements formed in the active regions.

Preferably, the deposited silicon oxide 11 is densified by heating the silicon body in an NO or $N_2O$-containing atmosphere for 0.5 to 3 minutes at a temperature in the range from 1000 to 1150° C. As a result, the etching rate of the densified silicon oxide in hydrogen-fluoride etching baths is similar to that of silicon oxide formed by thermal oxidation. By virtue of the high temperature, also mechanical stresses induced in the deposited silicon oxide during deposition are completely relaxed.

Preferably, the deposited silicon oxide 11 is subsequently densified by heating the silicon body in an NO or $N_2O$-containing atmosphere at a pressure of 1 atmosphere. Densification of the deposited silicon oxide can then be carried out in a customary "rapid thermal processing" reactor.

After removal of the "sacrificial oxide" layer, semiconductor elements, in this example MOS transistors, are formed in the active regions. The active regions 12 are then provided with a desired dopant 16 whereafter an approximately 10 nm thick gate-oxide layer 16 is formed by thermal oxidation on the active regions 12. Subsequently, gate electrodes 18 are formed in a customary manner from polycrystalline silicon by means of ion-implantation source and drain zones 19, and said gate electrodes 18 are provided with an edge isolation 20 for example in the form of spacers of silicon oxide.

Of course, also semiconductor elements other than MOS-transistors can be formed in the active regions 12. Apart from MOS-transistors, integrated circuits may also comprise, for example, memory elements, such as EPROM-cells, and also, for example, bipolar transistors.

I claim:

1. A method of manufacturing a semiconductor device, in which method trenches are formed in a surface of a silicon body which are filled with silicon oxide which is deposited from a gas phase and, subsequently, densified by means of a thermal treatment in a nitrogen-containing atmosphere, characterized in that the deposited silicon oxide is densified in an NO or $N_2O$-containing atmosphere.

2. A method as claimed in claim 1, characterized in that the deposited silicon oxide is densified by subjecting the silicon body in an NO or $N_2O$-containing atmosphere to a thermal treatment at a temperature of 1000 to 1150° C. for 0.5 to 3 minutes.

3. A method as claimed in claim 2, characterized in that the deposited silicon oxide is densified by heating the silicon body in an NO or $N_2O$-containing atmosphere at a pressure of 1 atmosphere.

* * * * *